(12) United States Patent
Hashimoto

(10) Patent No.: US 11,777,063 B2
(45) Date of Patent: Oct. 3, 2023

(54) METHOD FOR MANUFACTURING PLANAR LIGHT SOURCE, PLANAR LIGHT SOURCE, AND LIGHT SOURCE

(71) Applicant: NICHIA CORPORATION, Anan (JP)

(72) Inventor: Toru Hashimoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 392 days.

(21) Appl. No.: 17/163,014

(22) Filed: Jan. 29, 2021

(65) Prior Publication Data

US 2021/0242375 A1  Aug. 5, 2021

(30) Foreign Application Priority Data

Jan. 31, 2020 (JP) .................. 2020-015685

(51) Int. Cl.
| | |
|---|---|
| *H01L 33/50* | (2010.01) |
| *H01L 33/00* | (2010.01) |
| *H01L 33/54* | (2010.01) |
| *H01L 33/60* | (2010.01) |
| *H01L 33/58* | (2010.01) |
| H01L 25/075 | (2006.01) |

(52) U.S. Cl.
CPC ........ *H01L 33/502* (2013.01); *H01L 33/0095* (2013.01); *H01L 33/54* (2013.01); *H01L 33/60* (2013.01); *H01L 2933/005* (2013.01); *H01L 2933/0058* (2013.01); *H01L 2933/0091* (2013.01)

(58) Field of Classification Search
CPC ... H01L 33/60; H01L 33/54; H01L 2933/005; G02B 6/0011; G02B 6/0021; G02B 6/0055; G02B 6/0031
See application file for complete search history.

(56) References Cited

U.S. PATENT DOCUMENTS

| | | |
|---|---|---|
| 5,175,783 A | 12/1992 | Tatoh |
| 7,997,771 B2 | 8/2011 | Epstein et al. |
| 2005/0151147 A1 | 7/2005 | Izuno et al. |
| 2011/0037740 A1* | 2/2011 | Yamaguchi ....... G02F 1/133603 362/558 |
| 2019/0035986 A1 | 1/2019 | Maeda |

(Continued)

FOREIGN PATENT DOCUMENTS

| | | |
|---|---|---|
| JP | H3-286575 A | 12/1991 |
| JP | 2004-186488 A | 7/2004 |
| JP | 2005183777 A | 7/2005 |

(Continued)

*Primary Examiner* — Antonio B Crite

(74) *Attorney, Agent, or Firm* — Global IP Counselors, LLP

(57) ABSTRACT

A method for manufacturing a planar light source includes: preparing a structure body including a wiring substrate, a light guide plate including a first major surface, a second major surface, and an inner side surface defining a first hole with an opening on a first major surface side, and a light source arranged on the wiring substrate in the first hole; injecting a first resin material downward through the opening of the first hole, the first resin material including a light-diffusing agent; and curing the first resin material to form a first resin layer on a wiring substrate between the inner side surface of the first hole and a first side surface of a first light-transmitting member.

16 Claims, 17 Drawing Sheets

(56) References Cited

U.S. PATENT DOCUMENTS

2020/0006297 A1* 1/2020 Yamada .................. H01L 33/62
2020/0049876 A1   2/2020 Watanabe et al.

FOREIGN PATENT DOCUMENTS

| JP | 2007-200763 A | 8/2007 |
| JP | 2018-097974 A | 6/2018 |
| JP | 2019-029478 A | 2/2019 |
| KR | 20090117419 A | 11/2009 |
| WO | 2010070885 A1 | 6/2010 |

* cited by examiner

METHOD FOR MANUFACTURING PLANAR LIGHT SOURCE, PLANAR LIGHT SOURCE, AND LIGHT SOURCE

CROSS-REFERENCE TO RELATED APPLICATION

This application claims priority to Japanese Patent Application No. 2020-015685, filed on Jan. 31, 2020, the disclosure of which is hereby incorporated by reference in its entirety.

BACKGROUND

The invention relates to a method for manufacturing a planar light source, a planar light source, and a light source.

Light-emitting modules that combine a light guide plate and a light-emitting element such as a light-emitting diode or the like are widely utilized in planar light sources such as, for example, backlights of liquid crystal displays, etc. For example, Korean Patent No. 10-2009-0117419 discusses a structure including a light guide plate, a light source located in a through-hole formed in the light guide plate, and a reflective member located on the light source.

SUMMARY

The invention is directed to provide a method for manufacturing a planar light source, a planar light source, and a light source in which the light source is located on a wiring substrate in a first hole of a light guide plate, and a resin layer that includes a light-diffusing agent can be easily formed on the wiring substrate inside the first hole after the light source is placed while suppressing the formation of the resin layer on a side surface of the light source.

In one aspect of the invention, a method for manufacturing a planar light source, the method includes: preparing a structure body including a wiring substrate, a light guide plate arranged over the wiring substrate, the light guide plate including a first major surface, a second major surface facing toward the wiring substrate at a side opposite to the first major surface, and an inner side surface defining a first hole extending from the first major surface to the second major surface with an opening on a first major surface side, and a light source arranged on the wiring substrate in the first hole, the light source including a light-emitting element including an element upper surface, an element lower surface, and an element side surface between the element upper surface and the element lower surface, and a first light-transmitting member covering the element side surface and the element upper surface, the first light transmitting member including a first side surface and a protrusion, the protrusion including a second side surface protruding from the first side surface toward the inner side surface of the light guide plate; injecting a first resin material downward through the opening of the first hole of the structure body, the first resin material including a light-diffusing agent; and curing the first resin material to form a first resin layer on the wiring substrate between the inner side surface of the light guide plate and the first side surface of the first light-transmitting member.

In another aspect of the invention, a planar light source includes a wiring substrate, a light guide plate, a light-reflective member, a light source, and a first resin layer. The light guide plate is arranged over the wiring substrate, and includes a first major surface, a second major surface at a side opposite to the first major surface. The light guide plate defines a first hole extending from the first major surface to the second major surface with an opening on a first major surface side. The light-reflective member is arranged between the wiring substrate and the second major surface of the light guide plate. The light-reflective member defines a second hole at a position overlapping the first hole of the light guide plate in a plan view. The light source is placed on the wiring substrate in a through-hole defined by the first hole and the second hole. The light source includes a light-emitting element and a first light-transmitting member. The light-emitting element includes an element upper surface, an element lower surface, and an element side surface between the element upper surface and the element lower surface. The first light-transmitting member covers the element side surface and the element upper surface and includes a first side surface and a protrusion. The protrusion includes a second side surface protruding from the first side surface toward an inner side surface of the through-hole. The first resin layer is arranged on the wiring substrate in the through-hole. The first resin layer is light-reflective.

In another aspect of the invention, a light source includes a light-emitting element and a first light-transmitting member. The light-emitting element includes an electrode at a lower surface of the light-emitting element. The first light-transmitting member covers a side surface and an upper surface of the light-emitting element. The first light-transmitting member includes a first side surface and a protrusion. The protrusion includes a second side surface protruding outward of the first side surface.

With the light source being located on a wiring substrate in a first hole of a light guide plate, a resin layer that includes a light-diffusing agent can be easily formed on the wiring substrate inside the first hole after the light source is placed while suppressing the formation of the resin layer on a side surface of the light source.

DETAILED DESCRIPTION OF EMBODIMENTS

Figure 1:
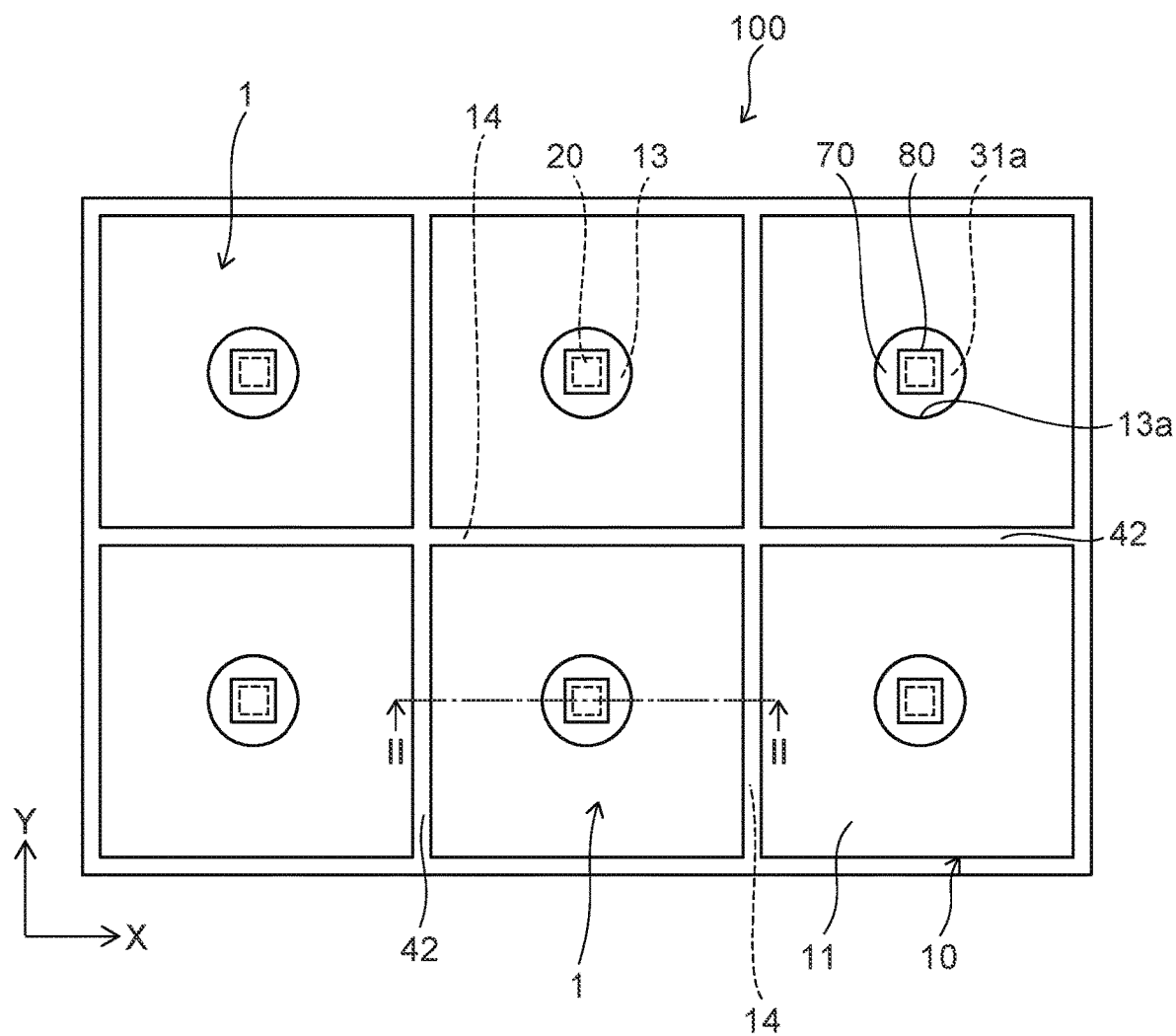
FIG. 1 is a schematic plan view of a planar light source of an embodiment of the invention.

Embodiments will now be described with reference to the drawings. The same components in the drawings are marked with the same reference numerals.

FIG. 1 is a schematic plan view of a planar light source 100 of an embodiment of the invention. FIG. 1 illustrates the light-emitting surface of the planar light source 100 when viewed in plan. In FIG. 1, two mutually-orthogonal directions parallel to the light-emitting surface of the planar light source 100 are taken as an X-direction and a Y-direction.

The planar light source 100 can include one or multiple light sources 20. When the planar light source 100 includes multiple light sources 20, the light sources 20 are separated from each other by a partitioning trench 14. One divided region also is called a light-emitting region 1. When the planar light source includes one light source 20, one planar light source includes one light-emitting region 1. Thus, a planar light source device can have a larger surface area by arranging multiple planar light sources that each include one light source 20 or multiple planar light sources 100 that each include multiple light sources 20.

The planar light source 100 shown in FIG. 1 has a rectangular exterior form having two sides extending along the X-direction and two sides extending along the Y-direction.

For example, one light-emitting region 1 can be used as a driving unit of local dimming. FIG. 1 illustrates the planar light source 100 that includes six light-emitting regions 1 divided into two rows and three columns. The number of the light-emitting regions 1 included in the planar light source 100 is not limited to the number shown in FIG. 1.

Figure 2:
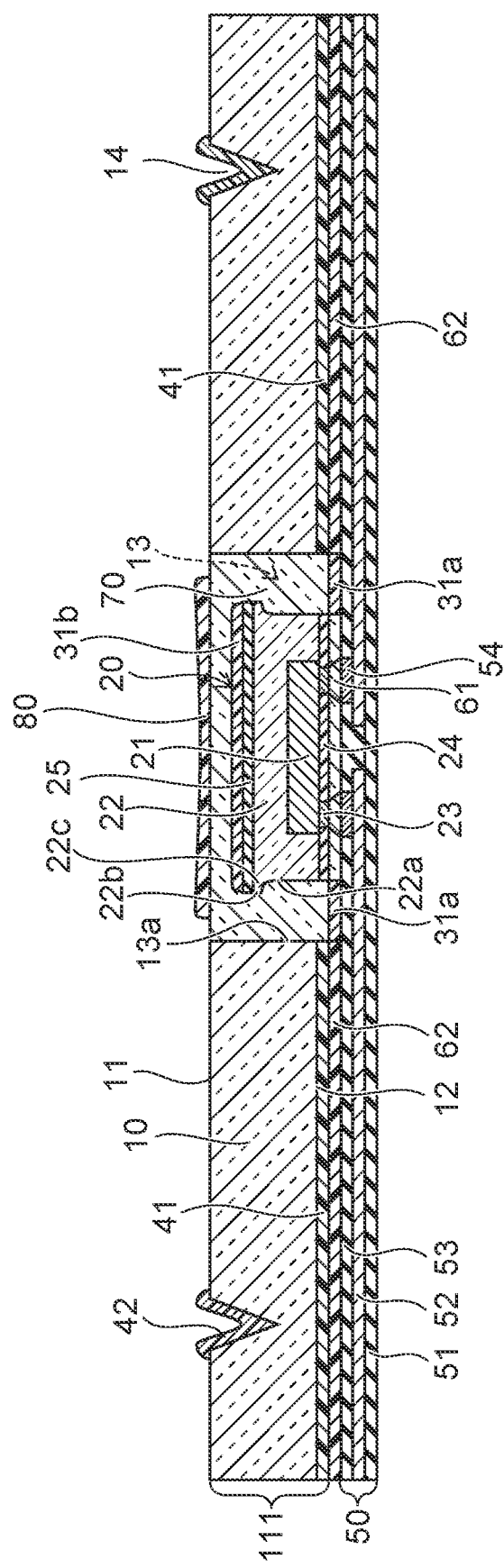
FIG. 2 is a schematic cross-sectional view along line II-II of FIG. 1.

FIG. 2 is a schematic cross-sectional view along line II-II of FIG. 1, and is a schematic cross section of a portion including one light source 20.

The planar light source 100 includes a wiring substrate 50, a stacked structure body 111, the light source 20, first resin layers 31a and 31b, a second resin layer 80, and a second light-transmitting member 70.

Figure 7:
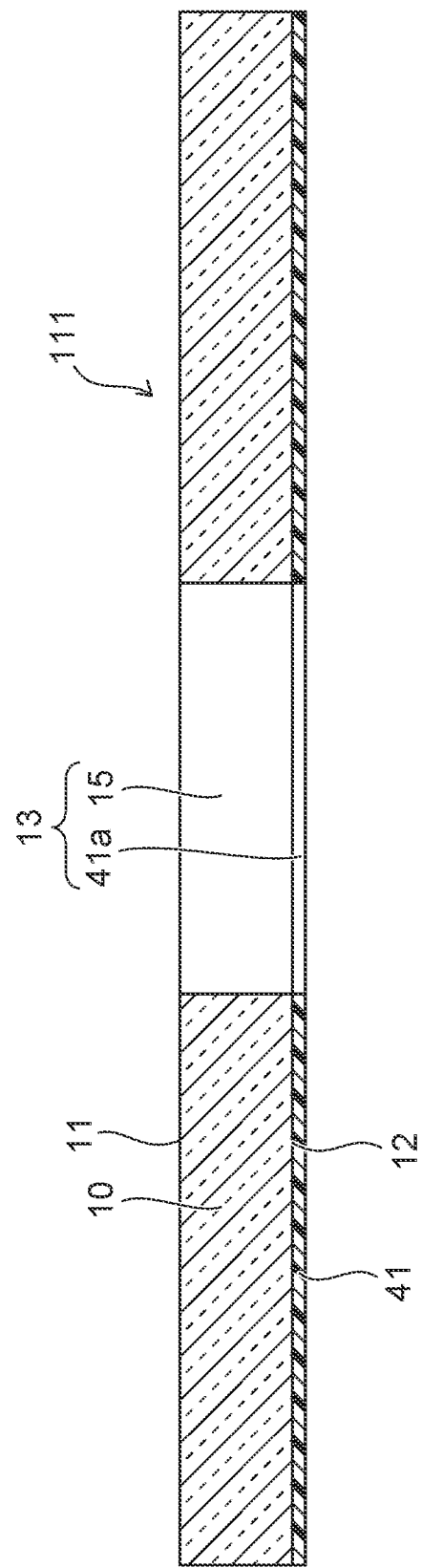

The stacked structure body 111 includes a light guide plate and a light-reflective member 41. As shown in FIG. 7, the light guide plate 10 includes a first hole 15. The light-reflective member 41 includes a second hole 41a at a position overlapping the first hole 15. In other words, the stacked structure body 111 includes a through-hole 13 that includes the first hole 15 and the second hole 41a. The first hole 15 and the second hole 41a can have the same width (diameter). Or, the first hole 15 can have a larger or smaller width (diameter) than the second hole 41a.

The inner side surfaces of the first and second holes 15 and 41a can be perpendicular surfaces or oblique surfaces with respect to a first major surface 11 or a second major surface 12 of the light guide plate 10. Also, the inner side surfaces of the first and second holes 15 and 41a can have shapes that combine perpendicular surfaces and/or oblique surfaces with respect to the first or second major surface 11 or 12 of the light guide plate 10.

The first hole 15 and the second hole 41a can be circular or elliptical when viewed in plan. The first hole 15 and the second hole 41a can be polygonal such as triangular, rectangular, hexagonal, octagonal, etc., when viewed in plan. It is favorable for the centers of the first and second holes 15 and 41a to match each other when viewed in plan.

The light guide plate 10 is transmissive to light emitted by the light source 20. The light source 20 includes a light-emitting element 21. The light that is emitted by the light source 20 refers to the light emitted by the light-emitting element 21. When the light source 20 includes a fluorescent substance, the light that is emitted by the light source 20 also includes the light emitted by the fluorescent substance. For example, it is favorable for the transmittance of the light guide plate 10 to the light from the light source 20 to be 80% or more, and more favorably 90% or more.

For example, a thermoplastic resin such as acrylic, polycarbonate, cyclic polyolefin, polyethylene terephthalate, polyester, or the like, a thermosetting resin such as epoxy, silicone, or the like, glass, etc., can be used as the material of the light guide plate 10.

The light guide plate 10 includes the first major surface 11 that is used as the light-emitting surface of the planar light source 100, and the second major surface 12 at the side opposite to the first major surface 11. As described above with reference to FIG. 7, the light guide plate 10 includes the first hole 15 that extends from the first major surface 11 to the second major surface 12.

It is favorable for the thickness of the light guide plate 10 to be, for example, not less than 200 μm and not more than 800 μm. In the thickness direction, the light guide plate 10 may include a single layer or a stacked body of multiple layers. When the light guide plate 10 includes a stacked body, a light-transmitting bonding layer may be provided between the layers. The layers of the stacked body may include different types of major materials.

One planar light source 100 can include multiple light sources 20. That is, one light guide plate 10 can include multiple first holes 15. In such a case as shown in FIG. 1, it is favorable for the light guide plate 10 to include the partitioning trench 14 in a lattice configuration that includes the partitioning trench 14 extending in a straight-line shape in the X-direction and the partitioning trench 14 extending in the Y-direction. The partitioning trench 14 divides the light-emitting regions 1. In other words, the region that is surrounded by the partitioning trench 14 is one light-emitting region 1.

FIG. 2 illustrates a bottomed partitioning trench 14 that has an opening at the first major surface 11 side and has a bottom that does not reach the second major surface 12. The bottom of the partitioning trench 14 can be at any position in the thickness direction of the light guide plate 10. For example, when it is desirable to suppress light leakage to the adjacent light-emitting regions 1, it is favorable for the thickness of the light guide plate to be 50% or more, more favorably 70%, and particularly favorably 90% or more. That is, it is favorable for the bottom of the partitioning trench 14 to be proximate to the second major surface 12.

Also, the partitioning trench 14 may be a bottomed trench that has an opening at the second major surface 12 side and a bottom that does not reach the first major surface 11.

The partitioning trench 14 may be separated from the first and second major surfaces 11 and 12. For example, the light guide plate 10 can have a two-light-guide-plate stacked structure in which a first light guide plate including a surface used as the first major surface 11 and a second light guide plate including a surface used as the second major surface 12 are stacked. The lower surface of the first light guide plate includes a bottomed first trench, and the upper surface of the second light guide plate includes a bottomed second trench. Then, by providing the first trench and the second trench to overlap when viewed in plan, the light guide plate can include a partitioning trench including the first and second trenches at a position separated from the first and second major surfaces 11 and 12.

The partitioning trench 14 may extend from the first major surface 11 to the second major surface 12. Also, a partitioning trench that extends through the light guide plate may communicate with a trench located in the light-reflective member, which is included with the light guide plate in the stacked structure body. That is, the partitioning trench can include a through-trench that extends through the light guide plate, and a bottomed through-trench that is located in the light-reflective member.

The shape of the partitioning trench 14 when viewed in plan can be determined according to the shape of the light-emitting region 1. For example, when the adjacent light-emitting regions 1 are rectangular, the partitioning trench 14 that is located between the adjacent light-emitting regions 1 has a straight-line shape with a constant width when viewed in plan. The width of the partitioning trench 14 can be, for example, not more than about 5% of the width of the light-emitting region 1. When the light-reflective member is located inside the partitioning trench 14, it is favorable for the partitioning trench 14 to have an opening width such that the light-reflective member can be disposed inside the partitioning trench 14. For example, when a resin material that includes a light-diffusing agent is used as the light-reflective member, the opening width of the partitioning trench 14 can be appropriately selected according to the viscosity of the resin material, etc. In particular, the viscosity of the light-reflective member easily increases when the content of the light-diffusing agent is increased to increase the reflectance of the light-reflective member. Therefore, if the opening width is too narrow, it is difficult to dispose the light-reflective member at the appropriate position of the inner side surface inside the partitioning trench 14. In such a case, it is favorable for the opening width of the partitioning trench 14 to be appropriately wide.

As shown in FIG. 2, a light-reflective member 42 can be provided inside the partitioning trench 14. It is favorable for the light-reflective member 42 to be reflective to the light emitted by the light source 20. For example, a white resin member that includes a light-diffusing agent can be used as the light-reflective member 42. For example, a fine particle of $TiO_2$, $SiO_2$, $Al_2O_3$, ZnO, or the like is an example of the light-diffusing agent. A light-reflective metal member of Al, Ag, etc., may be used as the light-reflective member 42. A member that has a lower refractive index than the refraction of the light guide plate 10 may be provided inside the partitioning trench 14. Air and the like are examples of the low-refractive-index member.

When the light-reflective member 42 is provided inside the partitioning trench 14, for example, the light-reflective member 42 can be along the shape of the inner side surface of the partitioning trench 14 as shown in FIG. 2. In other words, a portion of the upper surface of the light-reflective member 42 can be positioned lower than the first major surface 11 of the light guide plate 10. An example is shown herein in which the cross section of the partitioning trench 14 is V-shaped and the cross section of the light-reflective member 42 is V-shaped. It is favorable for the light-reflective member 42 to cover the entire inner side surface of the partitioning trench 14.

Also, the light-reflective member 42 that is located inside the partitioning trench 14 can be formed to fill the entire space inside the partitioning trench 14.

The light-reflective member 42 may include a portion that extends onto the first major surface 11 of the light guide plate 10 from the interior of the partitioning trench 14.

The light-reflective member 42 suppresses the light guidance between the adjacent light-emitting regions 1. For example, the light that is guided from a light-emitting region 1 in the light-emitting state to a light-emitting region 1 in the non-light-emitting state is limited. Local dimming that has the individual light-emitting regions 1 as the driving unit is possible thereby.

The light source 20 is located on the wiring substrate 50 inside the through-hole 13 of the stacked structure body 111. The light-reflective member 41 is provided in the second major surface 12 of the light guide plate 10.

The stacked structure body 111 is located on the wiring substrate 50. The second major surface 12 of the light guide plate 10 faces the wiring substrate 50, and the light-reflective member 41 is between the second major surface 12 and the wiring substrate 50.

The light-reflective member 41 is reflective to the light emitted by the light source 20. For example, a sheet-shaped resin material can be used as the light-reflective member 41. A white resin material that includes a light-diffusing agent or a white resin that includes many bubbles can be used as the light-reflective member 41. For example, a fine particle of $TiO_2$, $SiO_2$, $Al_2O_3$, ZnO, or the like is an example of the light-diffusing agent. For example, a thermoplastic resin such as acrylic, polycarbonate, cyclic polyolefin, polyethylene terephthalate, polyester, or the like, a thermosetting resin such as epoxy, silicone, or the like, glass, etc., can be used as the resin material included in the light-reflective member 41.

The light-reflective member 41 is bonded to the wiring substrate 50 via a bonding layer 62. The bonding layer 62 is, for example, a resin layer such as an epoxy resin, an acrylic resin, an olefin resin, etc. In other words, the light guide plate 10 is provided on the wiring substrate 50 with the bonding layer 62 and the light-reflective member 41 interposed.

Figure 3A:
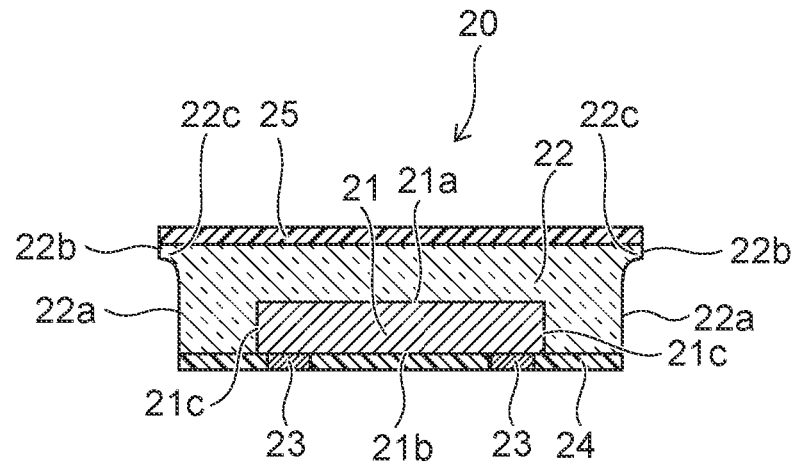
FIG. 3A is a schematic cross-sectional view of a light source of the embodiment of the invention.

FIG. 3A is a schematic cross-sectional view showing examples of the light source 20.

The light source 20 includes the light-emitting element 21 and a first light-transmitting member 22. The light source 20 may further include at least one of a cover member 24 or a light-modulating member 25.

The light-emitting element 21 includes a semiconductor stacked body and a pair of positive and negative electrodes 23. The light-emitting element 21 can emit ultraviolet light or visible light. The light-emitting element 21 can emit blue to red as the visible light. The semiconductor stacked body can include, for example, $In_xAl_yGa_{1-x-y}N$ ($0 \leq x$, $0 \leq y$, and $x+y \leq 1$).

The semiconductor stacked body of the light-emitting element 21 includes an element upper surface 21a, an element lower surface 21b, and an element side surface 21c between the element upper surface 21a and the element lower surface 21b. The pair of positive and negative electrodes 23 is located at the element lower surface 21b. The pair of positive and negative electrodes 23 may be located at the element upper surface 21a.

The first light-transmitting member 22 covers the element upper surface 21a and the element side surface 21c of the light-emitting element 21. The first light-transmitting member 22 includes a light-transmitting resin, and a fluorescent substance dispersed in the light-transmitting resin. The light-transmitting resin is, for example, a silicone resin or an epoxy resin. The fluorescent substance is a wavelength conversion substance that is excited by the light emitted by the light-emitting element 21 and emits light of a different wavelength from the wavelength of the light emitted by the light-emitting element 21. For example, the fluorescent substance can include an yttrium-aluminum-garnet-based fluorescent substance ($Y_3(Al, Ga)_5O_{12}$:Ce), a lutetium-aluminum-garnet-based fluorescent substance ($Lu_3(Al, Ga)_5O_{12}$:Ce), a terbium-aluminum-garnet-based fluorescent substance ($Tb_3(Al, Ga)_5O_{12}$:Ce), a β-sialon-based fluorescent substance ($Si_{6-z}Al_zO_zN_{8-z}$:Eu ($0<z<4.2$)), an α-sialonbased fluorescent substance ($Mz(Si, Al)_{12}(O, N)_{16}$ (however, $0<z\leq2$, and M is a lanthanide element other than Li, Mg, Ca, Y, La, and Ce)), a nitride fluorescent substance such as a nitrogen-including calcium aluminosilicate (CASN or SCASN)-based fluorescent substance (e.g., $(Sr, Ca) AlSiN_3$: Eu) or the like, a fluoride-based fluorescent substance such as a KSF-based fluorescent substance ($K_2SiF_6$:Mn), a MGF-based fluorescent substance ($3.5MgO \cdot 0.5MgF_2 \cdot GeO_2$:Mn), or the like, a silicate-based fluorescent substance (e.g., $(Ba, Sr)_2SiO_4$:Eu), a nitride fluorescent substance such as a chlorosilicate-based fluorescent substance (e.g., $Ca_8Mg(SiO_4)_4Cl_2$:Eu), etc. The first light-transmitting member 22 may include multiple types of fluorescent substances. Also, the first light-transmitting member 22 may have a configuration in which multiple layers of different types of fluorescent substances are stacked.

The first light-transmitting member 22 includes a first side surface 22a and a protrusion 22c. The protrusion 22c includes a second side surface 22b protruding outward of the first side surface 22a from the first side surface 22a. The protrusion 22c can be positioned at the upper side of the side surface of the first light-transmitting member 22. It is favorable for the protrusion 22c to be positioned at the upper end of the side surface of the first light-transmitting member 22. The protrusion 22c can be positioned at the entire periphery of the first light-transmitting member 22 when viewed in plan. For example, when the first light-transmitting member 22 is rectangular, the protrusion 22c can be provided at the four sides of the first light-transmitting member 22 when viewed in plan. The length of the first side surface 22a in the thickness direction of the first light-transmitting member 22 can be equal to or greater than the length of the second side surface 22b in the thickness direction of the first light-transmitting member 22. The surface area of the first side surface 22a can be equal to or greater than the surface area of the second side surface 22b. The width in the horizontal direction of the protrusion 22c, i.e., the distance between the first side surface 22a and the second side surface 22b, can be, for example, 5 μm to 50 μm.

The light source 20 can include the cover member 24. The cover member 24 is located at the element lower surface 21b of the light-emitting element 21. The cover member 24 is provided so that at least a portion of the surfaces (in FIG. 3A, the lower surfaces) of the electrodes 23 are exposed from under the cover member 24. The cover member 24 can be provided also at the lower surface of the first light-transmitting member 22 to cover the element side surface 21c of the light-emitting element 21.

The cover member 24 is reflective to the light emitted by the light source 20. The cover member 24 is, for example, a white resin member including a light-diffusing agent. For example, a fine particle of $TiO_2$, $SiO_2$, $Al_2O_3$, ZnO, or the like is an example of the light-diffusing agent.

The light source 20 can include the light-modulating member 25. The light-modulating member 25 is located at the upper surface of the first light-transmitting member 22. The light-modulating member 25 covers the upper surface of the first light-transmitting member 22. The light-modulating member 25 can be provided at the upper surface of the protrusion 22c. The light-modulating member 25 is reflective and transmissive to the light emitted by the light-emitting element 21 and the fluorescent substance so that the light is partially reflected by and partially transmitted through the light-modulating member 25.

The light-modulating member 25 can include a light-transmitting resin, and a light-diffusing agent dispersed in the light-transmitting resin. The light-transmitting resin is, for example, a silicone resin or an epoxy resin. For example, a fine particle of $TiO_2$, $SiO_2$, $Al_2O_3$, ZnO, or the like is an example of the light-diffusing agent. The light-modulating member 25 may be, for example, a light-reflective metal member of Al, Ag, or the like, or a DBR (Distributed Bragg Reflector).

As shown in FIG. 2, the first resin layer 31a is located on the wiring substrate 50 at the periphery of the light source 20 inside the through-hole 13. The first resin layer 31a can include, for example, a white resin layer including a fine particle of titanium oxide ($TiO_2$), $SiO_2$, $Al_2O_3$, ZnO, or the like as a light-diffusing agent.

As shown in FIG. 1, the first resin layer 31a is located on the wiring substrate 50 between an inner side surface 13a of the through-hole 13 and the first side surface 22a of the first light-transmitting member 22 of the light source 20 when viewed in plan. The first resin layer 31a may be formed between the wiring substrate 50 and the lower surface of the light source 20.

The first resin layer 31b that includes the same material as the first resin layer 31a may be provided on the upper surface of the light source 20. A light-reflective third resin layer that includes a different material from the first resin layer 31a may be provided on the upper surface of the light source 20. As described below, the first resin layer 31b can be formed of the same material in the same process as the first resin layer 31a. However, the first resin layer 31b is not limited thereto; the first resin layer 31b can be formed of the same material in a different process from the first resin layer 31a.

The second light-transmitting member 70 is provided inside the through-hole 13 of the stacked structure body 111. The second light-transmitting member 70 is transmissive to the light emitted by the light source 20 and can include, for example, the same resin as the material of the light guide plate 10 or a resin having a small refractive index difference with the material of the light guide plate 10. Or, glass may be used as the material of the second light-transmitting member 70.

The second light-transmitting member 70 is provided between the side surface of the light source 20 and the inner side surface 13a of the through-hole 13. The second light-transmitting member 70 can be disposed so that a space such as an air layer or the like is not formed between the second light-transmitting member 70 and the side surface of the light source 20 or between the second light-transmitting member 70 and the inner side surface 13a of the through-hole 13.

The second light-transmitting member 70 is located on the first resin layers 31a and 31b and covers the first resin layers 31a and 31b. The upper surface of the second light-transmitting member 70 can be a flat surface. Or, the upper surface of the second light-transmitting member 70 can be a concave or convex curved surface. The second light-transmitting member 70 can contact the entire surface of the inner surface of the through-hole 13. Or, the second light-transmitting member 70 can be provided so that a portion of the inner side surface of the first hole is exposed. The second light-transmitting member 70 may include a portion extending onto the first major surface 11 of the light guide plate 10 from the interior of the through-hole 13.

The wiring substrate 50 includes an insulating base 51, a wiring layer 52 provided on the insulating base 51, an insulating cover layer 53 covering the wiring layer 52, and a pad 54 connected to the wiring layer 52. The insulating base 51 and the cover layer 53 can include, for example, a resin such as polyimide, polyethylene naphthalate, polyethylene terephthalate, etc. The wiring layer 52 and the pad 54 can include, for example, a metal material such as copper, aluminum, etc.

The electrode 23 of the light source 20 is bonded to the pad 54 via a conductive bonding member 61. The bonding member 61 can include, for example, solder such as Au—Sn, Au—Ag—Cu, Au—Bi, etc.

The second light-transmitting member 70 may be provided also between the light source 20 and the wiring substrate 50 and around the bonding member 61.

The second resin layer 80 is located on the second light-transmitting member 70. The second resin layer 80 is reflective and transmissive to the light emitted by the light source 20. The second resin layer 80 can be a resin member that includes a light-diffusing agent. The second resin layer 80 can cover the entirety or a portion of the upper surface of the second light-transmitting member 70. It is favorable for the second resin layer 80 to overlap the light source 20 when viewed in plan.

In the example shown in FIG. 2, the second resin layer 80 overlaps the light source 20 when viewed in plan. As shown in FIG. 1, the second resin layer 80 is rectangular and is larger than the rectangular light source 20 when viewed in plan. The second resin layer 80 can have a shape such as circular, triangular, hexagonal, octagonal, etc., when viewed in plan. The second resin layer 80 may extend onto the upper surface of the second light-transmitting member 70 and the first major surface 11 of the light guide plate at the periphery of the upper surface of the second light-transmitting member 70. For example, a fine particle of $TiO_2$, $SiO_2$, $Al_2O_3$, $ZnO$, or the like is an example of the light-diffusing agent.

The second light-transmitting member 70 is located between the first resin layer 31b and the second resin layer 80 on the light source 20. The transmittance for the light emitted by the light source 20 is higher in the second light-transmitting member 70 than in the first resin layer 31b and the second resin layer 80. The transmittance of the second light-transmitting member 70 for the light emitted by the light source 20 can be 2 times to 100 times the transmittances of the first resin layer 31b and the second resin layer 80.

The light-modulating member 25 and the first resin layer 31b that are on the light source 20 diffusely reflect a portion of the light emitted directly upward from the light source 20 and transmit another portion of the light. Thereby, in light-emitting regions 1 of the planar light source 100, the luminance of the region directly above the light source 20 can be suppressed from being exceptionally greater than the luminance of other regions. That is, the unevenness of the light emitted from one light-emitting region 1 defined by the partitioning trench 14 can be reduced.

In the embodiment, the second resin layer 80 can be disposed on the second light-transmitting member 70 to be separated from the first resin layer 31b. In other words, the second light-transmitting member 70 that has a higher transmittance than the first resin layer 31b and the second resin layer 80 is interposed between the first resin layer 31b and the second resin layer 80. The light that is emitted from the light source 20, the light that is reflected by the first resin layer 31a at the periphery of the light source 20, etc., are guided to the second light-transmitting member 70 between the first resin layer 31b and the second resin layer 80. A portion of the light that is guided to the second light-transmitting member 70 is diffusely reflected by the second resin layer 80, and another portion of the light passes through the second resin layer 80. The region directly above the light source 20 can be not too bright and not too dark; as a result, the uneven luminance in the light-emitting surface of the light-emitting region can be reduced thereby.

The cover member 24 that is provided at the lower surface of the light source 20 and the first resin layer 31a that is provided on the wiring substrate 50 at the periphery of the light source 20 suppress the exposure to the light emitted from the light source of the wiring substrate 50 at the vicinity of the light source 20, and the degradation of the wiring substrate 50 can be prevented. Because the cover member 24 and the first resin layer 31a are light-reflective and include a light-diffusing agent, the light can be reflected toward the first major surface 11 side, which is the light-emitting surface of the planar light source 100, and the luminance of the light extracted from the first major surface 11 can be increased.

The light from the light source 20 is guided toward the partitioning trench 14 through the light guide plate 10 in the region between the first major surface 11 and the light-reflective member 41 provided at the second major surface 12 of the light guide plate 10 while being repeatedly reflected by the light-reflective member 41 and reflected at the first major surface 11. A portion of the light that travels toward the first major surface 11 in the region between the light-reflective member 41 and the first major surface 11 is extracted outside the light guide plate 10 from the first major surface 11.

A method for manufacturing the planar light source 100 will now be described.

Figure 11:
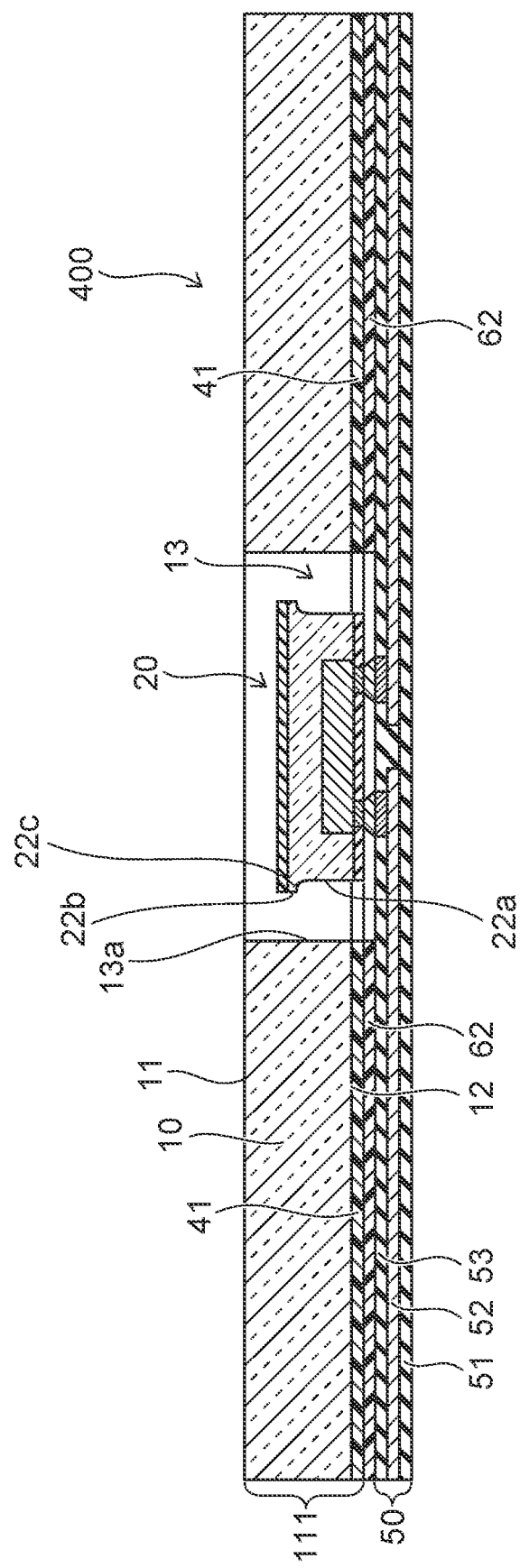

The method for manufacturing the planar light source 100 of the embodiment includes a process of preparing a structure body 400 shown in FIG. 11. The process of preparing the structure body 400 includes a process of preparing the light source 20 and a process of preparing the stacked structure body 111.

FIGS. 4A to 5B are schematic cross-sectional views showing processes of preparing the light source 20.

Figure 4A:
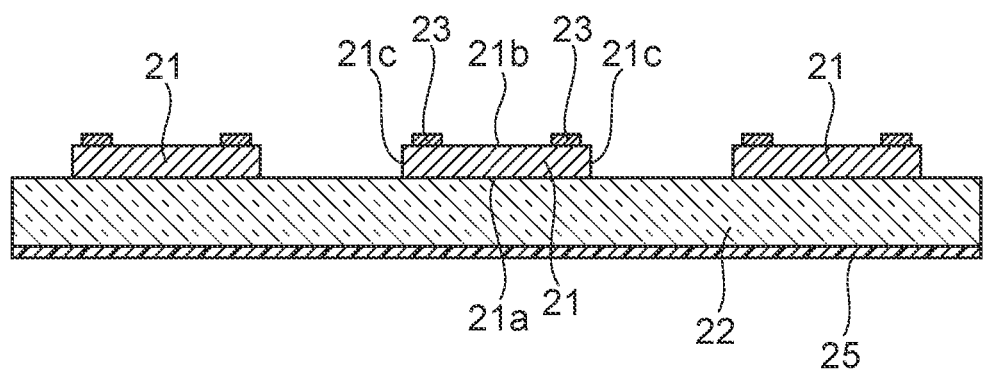
FIG. 4A to FIG. 5B are schematic cross-sectional views showing a method for manufacturing the light source of the embodiment of the invention.

As shown in FIG. 4A, the sheet-shaped first light-transmitting member 22 is prepared. The light-modulating member 25 is located at one surface (in FIG. 4A, the lower surface) of the first light-transmitting member 22. At this time, the first light-transmitting member 22 is not completely cured and is in a highly viscous state sufficient to maintain the sheet-like shape.

For example, the first light-transmitting member 22 can be prepared by preparing a support member, coating the first light-transmitting member 22 as a liquid onto the support member by using a method such as printing, spraying, potting, coating, etc., and by subsequently heating to a temperature of, for example, about 30° C. to 100° C. The first light-transmitting member 22 may be prepared by procuring.

The light-modulating member 25 can be prepared as a sheet that is not completely cured or as a cured sheet. For example, the first light-transmitting member 22 that is not completely cured and the light-modulating member 25 that is not completely cured can be stacked. Or, the cured light-modulating member 25 and the first light-transmitting member 22 that is not completely cured can be stacked. The light-modulating member that is not completely cured can be formed by a method similar to that of the first light-transmitting member 22 described above.

The cured light-modulating member 25 can be prepared by coating the liquid light-modulating member 25 onto the support member by using a coating method such as printing, spraying, potting, coating, etc., and by subsequently heating at a temperature of, for example, about 30° C. to 150° C. The light-modulating member 25 may be prepared by procuring.

Then, the multiple light-emitting elements 21 are placed on the other surface (in FIG. 4A, the upper surface) of the first light-transmitting member 22. The light-emitting element 21 is placed so that the element upper surface 21a faces the other surface of the first light-transmitting member 22; and the element lower surface 21b, where the electrodes 23 are located, faces upward. Before placing the light-emitting elements 21, a light-transmitting resin material may be provided as a bonding agent on the first light-transmitting member 22.

Figure 4B:
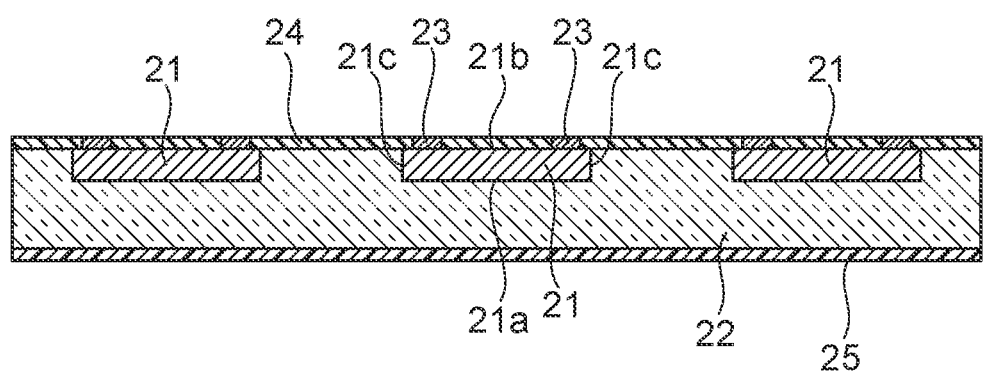

Then, the multiple light-emitting elements 21 that are placed on the first light-transmitting member 22 are pressed so that the semiconductor stacked bodies of the light-emitting elements 21 are positioned inside the first light-transmitting member 22. Thereby, as shown in FIG. 4B, the element side surface 21c and the element upper surface 21a of the light-emitting element 21 are covered with the first light-transmitting member 22. The first light-transmitting member 22 is cured by the heating in this state.

Continuing, the cover member 24 that covers the other surface of the first light-transmitting member 22 and the element lower surface 21b of the light-emitting element 21 is formed. The cover member 24 can be formed by coating the liquid cover member 24 by using, for example, printing, spraying, potting, etc. Or, the cover member 24 can be molded by injection molding, compression molding, transfer molding, etc. At this time, a process of forming the cover member 24 to cover the entire surfaces of the electrodes 23 and a process of removing a portion of the cover member 24 to expose at least a portion of the electrodes 23 are included. Polishing, blasting, etc., are examples of the method for removing the cover member 24.

Thus, the aggregate of the light source 20 is formed.

Figure 5A:
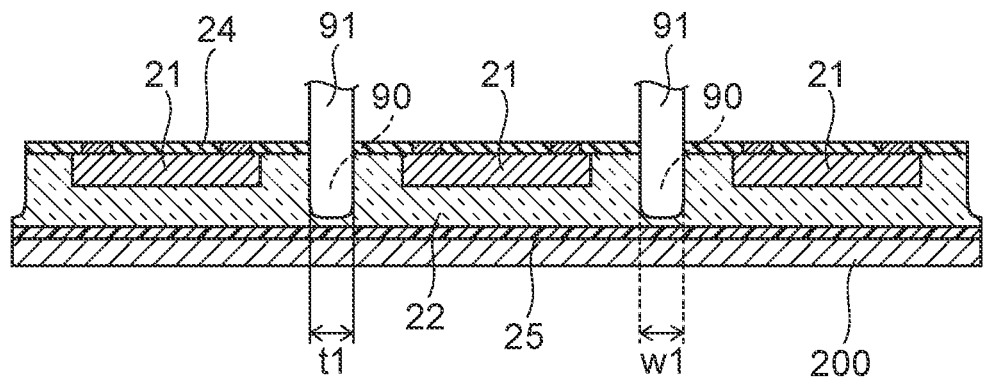

Then, the aggregate of the light source 20 is disposed so that the light-modulating member 25 and the upper surface of a dicing sheet 200 shown in FIG. 5A face each other. Then, as shown in FIG. 5A, a portion of the cover member 24 and a portion of the first light-transmitting member 22 between the adjacent light-emitting elements 21 are removed using a first blade 91 having a first blade thickness t1. Thereby, a first trench 90 is formed to have a first width w1 to divide the multiple light-emitting elements 21 in, for example, a lattice configuration. The first trench 90 does not reach the light-modulating member 25; the bottom surface of the first trench 90 is positioned slightly above the light-modulating member 25.

Figure 5B:
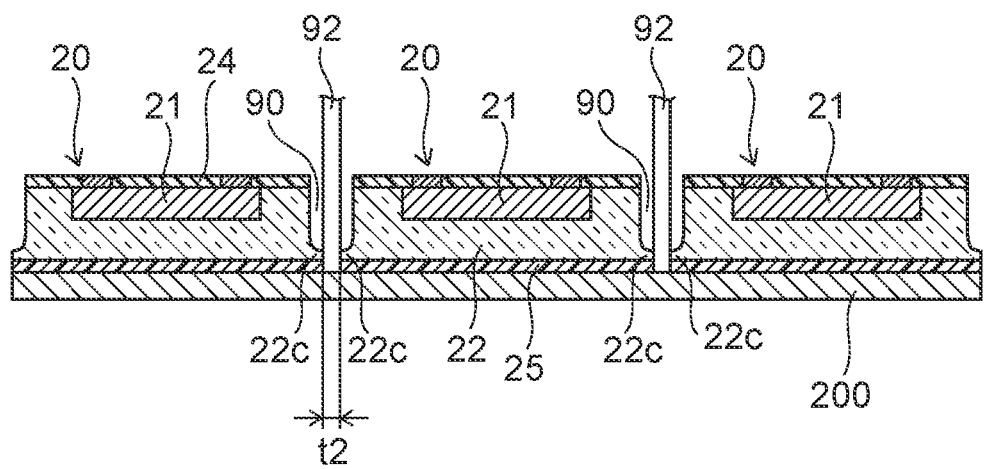

After forming the first trench 90, a second blade 92 that has a second blade thickness t2 that is less than the first blade thickness t1 is inserted into the first trench 90 as shown in FIG. 5B, and the light-modulating member 25 and the remaining portion and the light-modulating member 25 of the first light-transmitting member 22 that is lower than the bottom surface of the first trench 90 are removed using the second blade 92. Thereby, the first light-transmitting member 22 and the light-modulating member 25 are cut and singulated into the multiple light sources 20. The first blade or the second blade can be a rotary blade such as a dicing saw or the like, or a cutter such as a Thomson blade, etc.

The protrusion 22c, which is described above, is formed in the first light-transmitting member 22 by cutting the first light-transmitting member 22 by using the first blade 91 and the second blade 92, which have different blade thicknesses. In other words, the light source 20 that includes the protrusion 22c is obtained.

Figure 6:
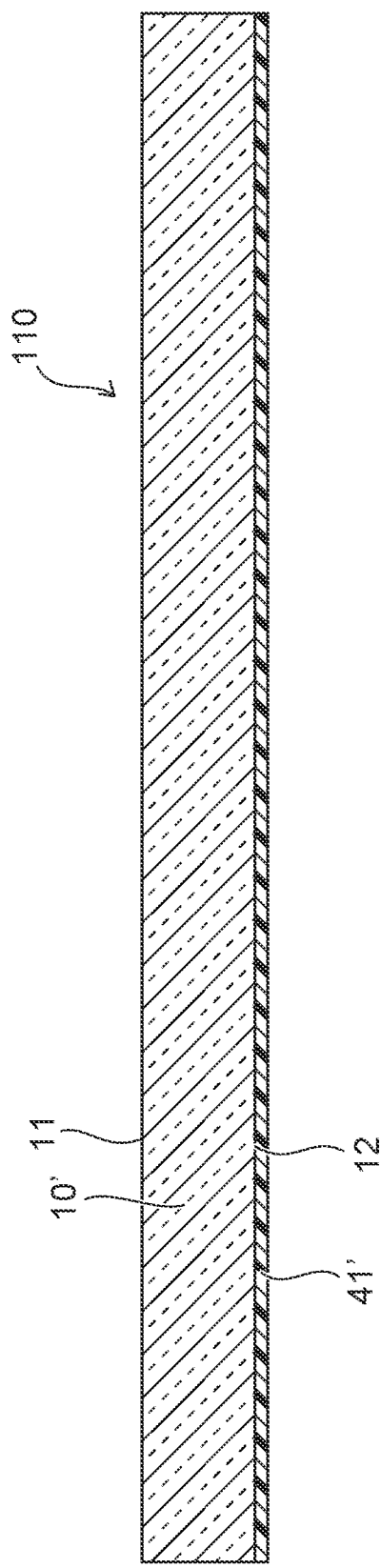
FIG. 6 and FIG. 7 are schematic cross-sectional views showing a method for manufacturing a stacked body of the embodiment of the invention.
Figure 8A:
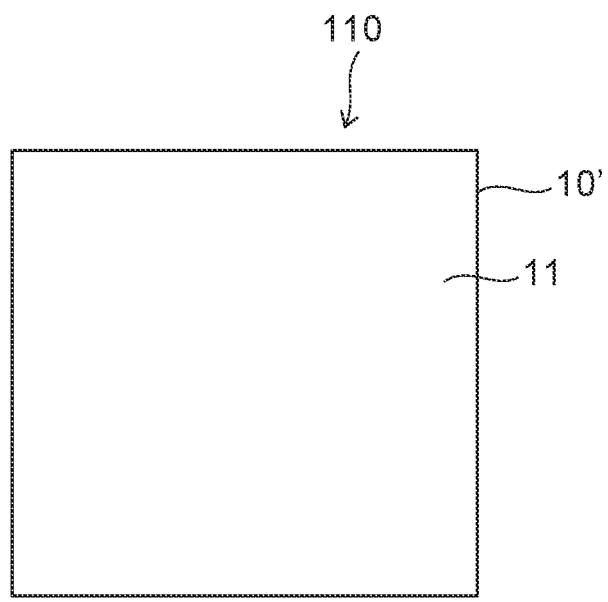
FIG. 8A and FIG. 8B are schematic plan views showing a method for manufacturing the stacked body of the embodiment of the invention.
Figure 8B:
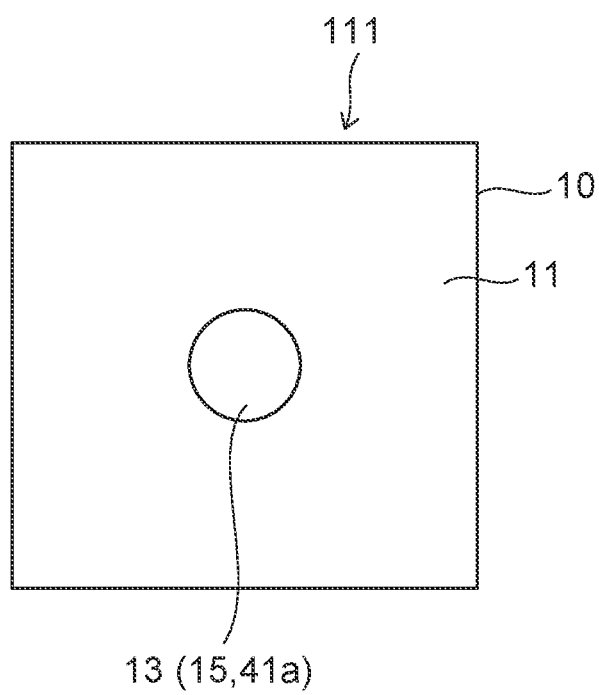

FIGS. 6 and 7 are schematic cross-sectional views showing the process of preparing the stacked structure body 111, and FIGS. 8A and 8B are schematic plan views showing the process of preparing the stacked structure body 111.

As shown in FIGS. 6 and 8A, the process of preparing the stacked structure body 111 includes a process of preparing a first stacked structure body 110. The first stacked structure body 110 includes a first light guide plate 10' that includes the first major surface 11 and the second major surface 12 at the side opposite to the first major surface 11, and a light-reflective member 41' that is provided at the second major surface 12 of the first light guide plate 10'.

The through-hole 13, which constitutes the first hole 15 and the second hole 41a shown in FIGS. 7 and 8B, is formed in the first stacked structure body 110. The second hole 41a and the light guide plate 10 including the first hole 15 are formed, and the stacked structure body 111 that includes the light-reflective member 41 provided at the second major surface 12 of the light guide plate 10 is obtained thereby.

The first hole 15 extends through the light guide plate 10. The second hole 41a extends through the light-reflective member 41 and is formed at the same position (an overlapping position) as the first hole 15 of the light guide plate 10 when viewed in plan.

Figure 9:
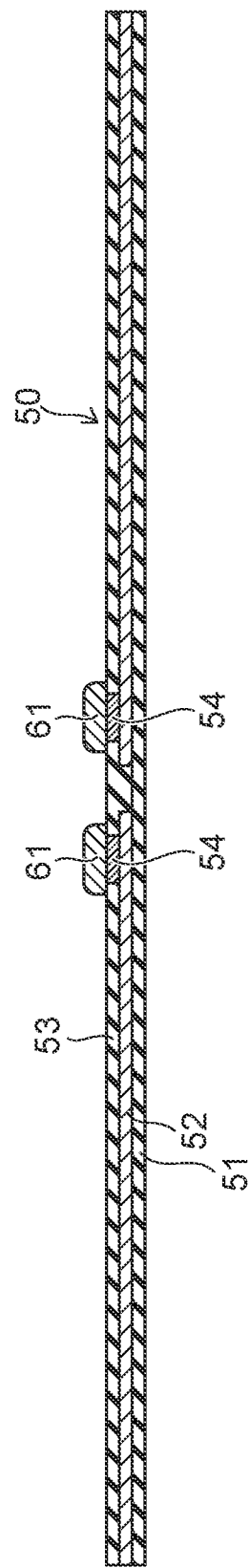
FIG. 9 to FIG. 15 are schematic cross-sectional views showing a method for manufacturing the planar light source of the embodiment of the invention.

After preparing the light source 20 and the stacked structure body 111, the process of FIG. 9 and the subsequent processes are continued. The stacked structure body 111 that includes the through-hole 13 may be prepared by procuring. Also, the stacked structure body 111 may be prepared by procuring the first stacked structure body 110 that does not include a through-hole and by forming the through-hole 13. Or, the stacked structure body 111 may be prepared by procuring the first light guide plate 10' that does not include the first hole or the light-reflective member 41' that does not include the second hole, by forming the first stacked structure body 110 by stacking these members, and by forming the through-hole 13.

Then, the wiring substrate 50 is prepared. Then, as shown in FIG. 9, the bonding member 61 is supplied onto the pad 54 of the wiring substrate 50. For example, solder is supplied as the bonding member 61 by a method such as printing, a jet dispenser, etc.

Figure 10:
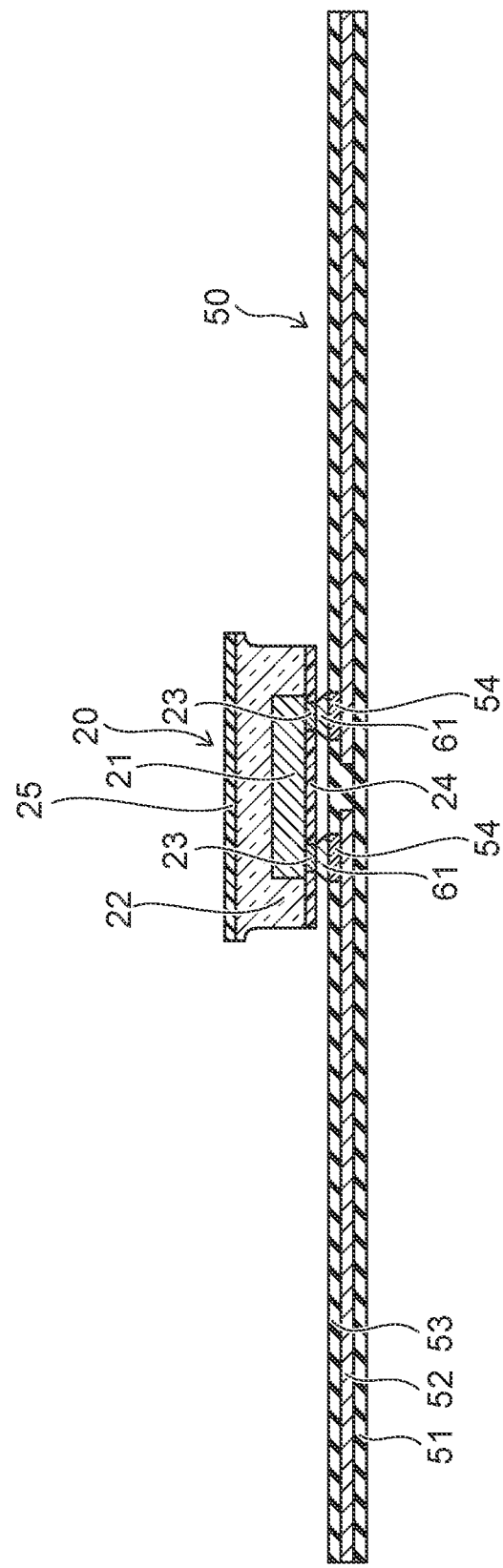

As shown in FIG. 10, the light source 20 is disposed on the wiring substrate 50 so that the electrodes 23 of the light-emitting element 21 contact the bonding members 61. The electrodes 23 of the light-emitting element 21 and the pads 54 of the wiring substrate 50 are connected via the bonding members 61 by placing inside a reflow furnace in this state.

After disposing the light source 20 on the wiring substrate 50, the stacked structure body 111 is bonded to the wiring substrate 50 so that the light source 20 is positioned inside the through-hole 13 of the stacked structure body 111 as shown in FIG. 11. The bonding layer 62 is interposed between the light-reflective member 41 of the stacked structure body 111 and the cover layer 53 of the wiring substrate 50. The structure body 400 that includes the wiring substrate 50, the stacked structure body 111, and the light source 20 is obtained thereby. The bonding layer 62 may be an adhesive sheet that is pre-bonded to the stacked structure body 111. In such a case, a stacked structure body that has a three-layer structure including the adhesive sheet but not including the through-hole may be prepared, and the through-hole 13 that extends through the three layers may be formed.

A gap exists between the inner side surface 13a of the through-hole 13 and the side surface of the light source 20 located inside the through-hole 13. The second side surface 22b of the protrusion 22c of the first light-transmitting member 22 of the light source 20 protrudes toward the inner side surface 13a side of the through-hole 13 from the first side surface 22a.

Figure 16A:
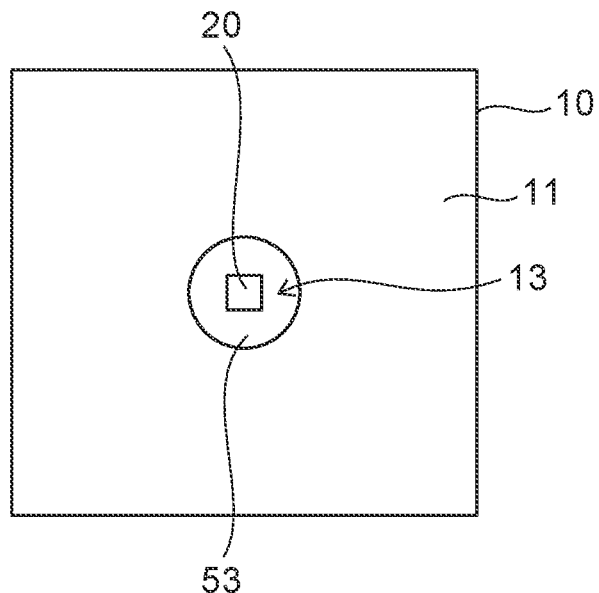
FIG. 16A and FIG. 16B are schematic plan views showing a method for manufacturing the planar light source of the embodiment of the invention.

When the first major surface 11 is viewed in plan as shown in FIG. 16A, the upper surface of the cover layer 53 of the wiring substrate 50 is exposed at the periphery of the light source 20 inside the through-hole 13.

Figure 12:
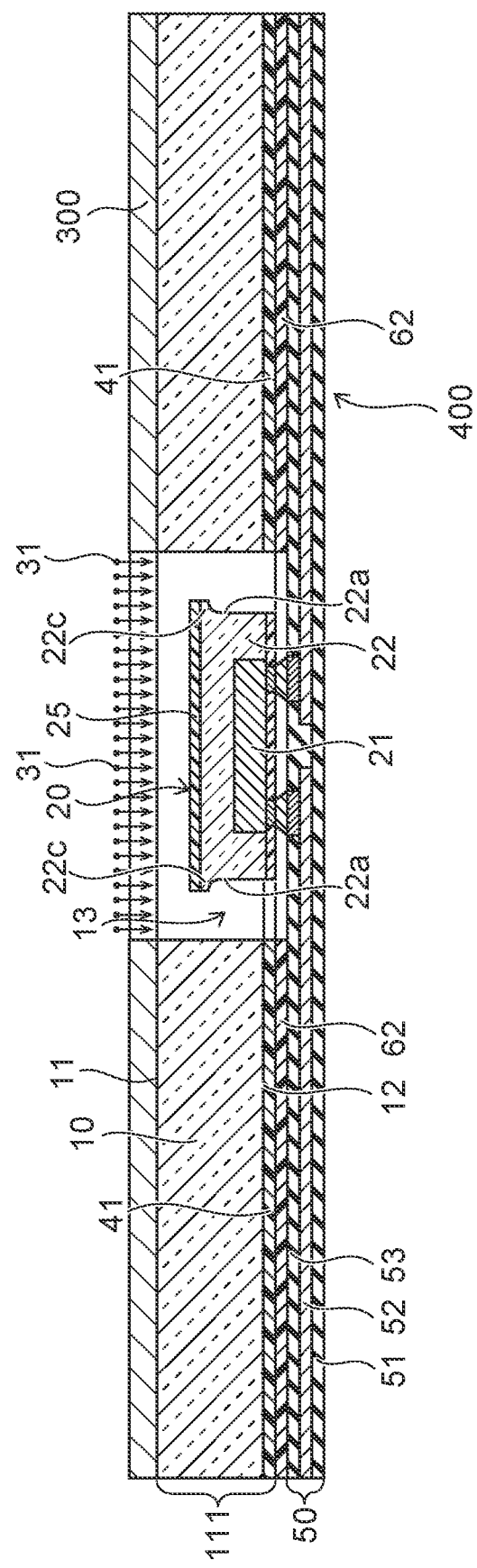

After forming the structure body 400, the first major surface 11 of the light guide plate 10 is covered with a mask 300 as shown in FIG. 12. The through-hole 13 is not covered with the mask 300. In this state, a first resin material 31 that includes a light-diffusing agent is injected downward from the opening of the through-hole 13 of the structure body 400 at the first major surface 11 side.

For example, the first resin material 31 is injected in droplet form or mist-like form without contacting the structure body 400 by using a technique using a jet dispenser, spraying, inkjet, etc. The first resin material 31 is injected substantially perpendicular to the upper surface of the wiring substrate 50.

Figure 13:
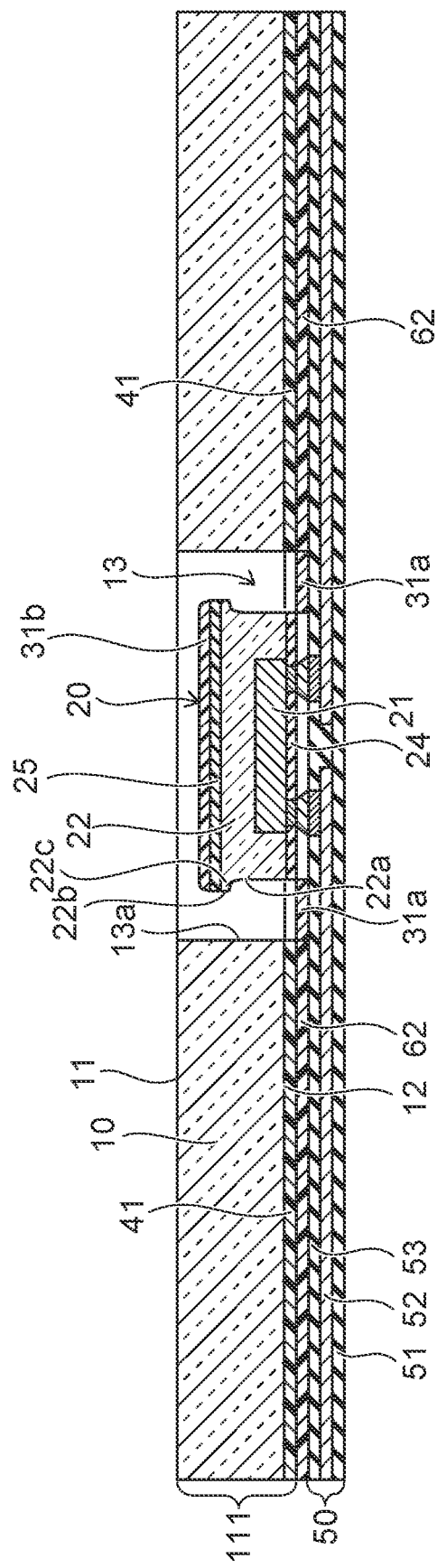

The first resin material 31 is cured after injecting the first resin material 31 into the through-hole 13. As shown in FIG. 13, the first resin layer 31a is formed on the wiring substrate 50 at the periphery of the light source 20 inside the through-hole 13 by curing the first resin material 31. The first resin layer 31a may be formed to enter the gap between the wiring substrate 50 and the lower surface of the light source 20.

Figure 16B:
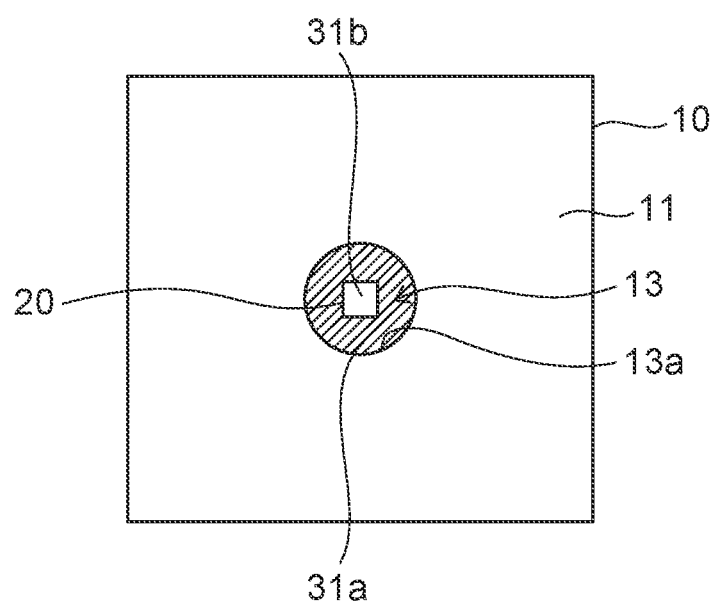

The first resin layer 31a is formed on the wiring substrate 50 between the inner side surface 13a of the through-hole 13 and the first side surface 22a of the first light-transmitting member 22 when viewed in plan. In other words, in the plan view of FIG. 16A, the surface of the cover layer 53 of the wiring substrate 50 exposed inside the through-hole 13 is covered with the first resin layer 31a. The first resin layer 31a inside the through-hole 13 is illustrated by diagonal lines in the plan view of FIG. 16B.

The first resin material 31 is injected also onto the upper surface of the light source 20; the first resin layer 31b is formed on the light source 20 as shown in FIG. 13 by curing the first resin material 31 on the light source 20. The first resin layer 31b and the light-modulating member 25 formed at the upper surface of the first light-transmitting member 22 function as a light-modulating member that suppresses the luminance of the region directly above the light source 20 from becoming extremely high compared to the luminance of the other regions.

According to the embodiment, the protrusion 22c that protrudes like an eave is provided in the side surface of the first light-transmitting member 22 of the light source 20. When the through-hole 13 is viewed from the opening at the first major surface 11 side, the first side surface 22a of the first light-transmitting member 22 is hidden below the protrusion 22c. Therefore, when injecting the first resin material 31 into the through-hole 13, the adhesion of the first resin material 31 on the first side surface 22a can be suppressed. Because the first side surface 22a is the greater part of the side surface of the light source 20, and because the first side surface 22a is not covered with the first resin material 31, the light that is emitted from the first side surface 22a can be guided into the light guide plate 10 via the inner side surface 13a of the through-hole 13. The luminance of the light emitted from the first major surface 11, which is the light-emitting surface, can be increased thereby.

Figure 14:
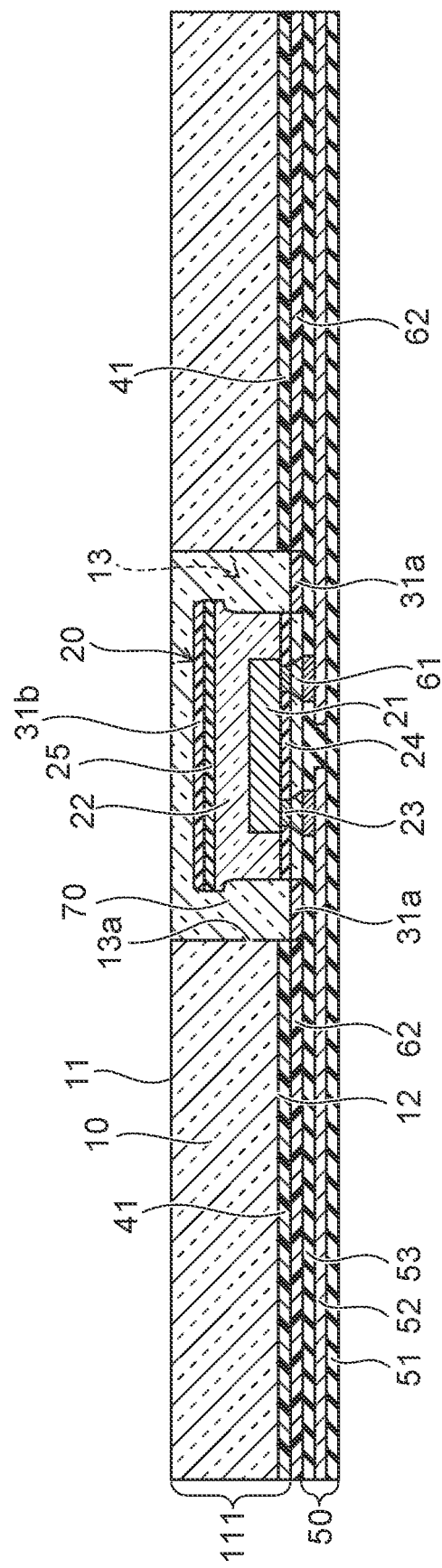

After forming the first resin layers 31a and 31b, the second light-transmitting member 70 is formed inside the through-hole 13 as shown in FIG. 14. The second light-transmitting member 70 is formed on the first resin layers 31a and 31b and covers the first resin layers 31a and 31b. The second light-transmitting member 70 covers the inner side surface 13a of the through-hole 13 and the side surface of the light source 20.

Figure 15:
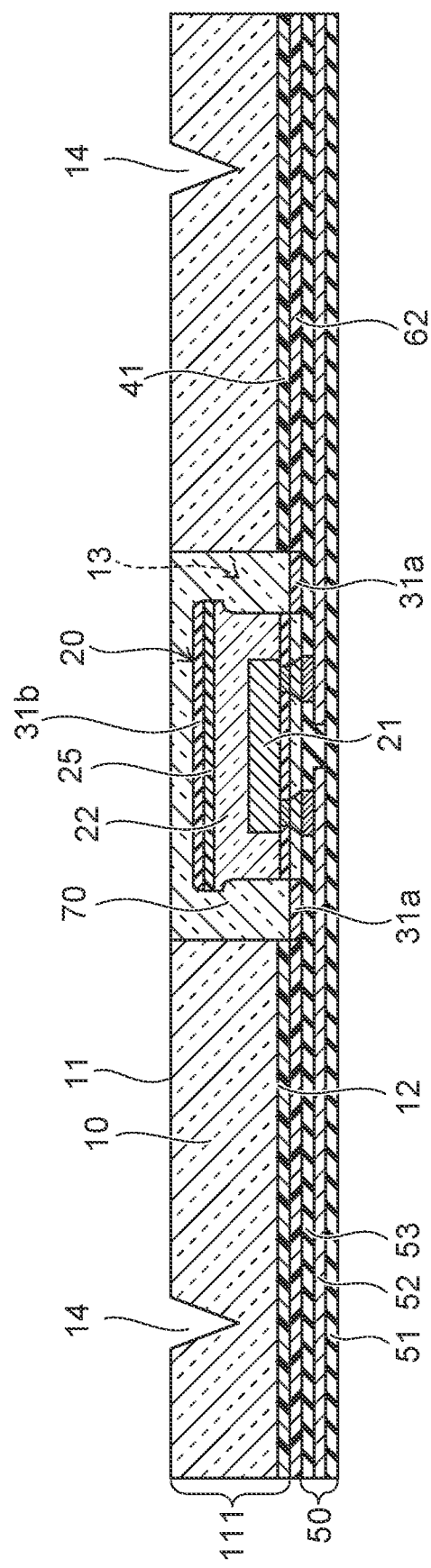

After forming the second light-transmitting member 70, the partitioning trench 14 is formed in the light guide plate 10 as shown in FIG. 15. For example, the partitioning trench 14 is formed using a rotary blade such as a dicing saw or the like, a cutter such as a Thomson blade, etc.

As shown in FIG. 2, a process of forming the light-reflective member 42 inside the partitioning trench 14 may be included. Also, a process of forming the second resin layer 80 that includes a light-diffusing agent on the second light-transmitting member 70 may be included. The light-reflective member 42 and the second resin layer 80 can be simultaneously formed of the same material. For example, the light-reflective member 42 and the second resin layer 80 are formed by printing or inkjet.

Figure 3B:
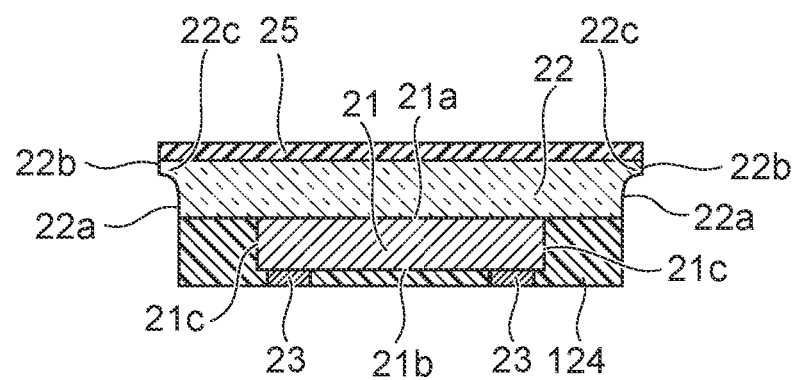
FIG. 3B is a schematic cross-sectional view of a light source of another embodiment of the invention.

FIG. 3B is a schematic cross-sectional view of another example of a light source.

A cover member 124 covers the element side surface 21c and the element lower surface 21b of the light-emitting element 21. The cover member 124 is reflective to the light emitted by the light source 20. For example, the cover member 124 can include a material similar to the cover member 24 used in the light source 20 shown in FIG. 3A.

The first light-transmitting member 22 is located on the element upper surface 21a of the light-emitting element 21. The first light-transmitting member 22 is located also on the cover member 124 covering the element side surface 21c of the light-emitting element 21.

Figure 17:
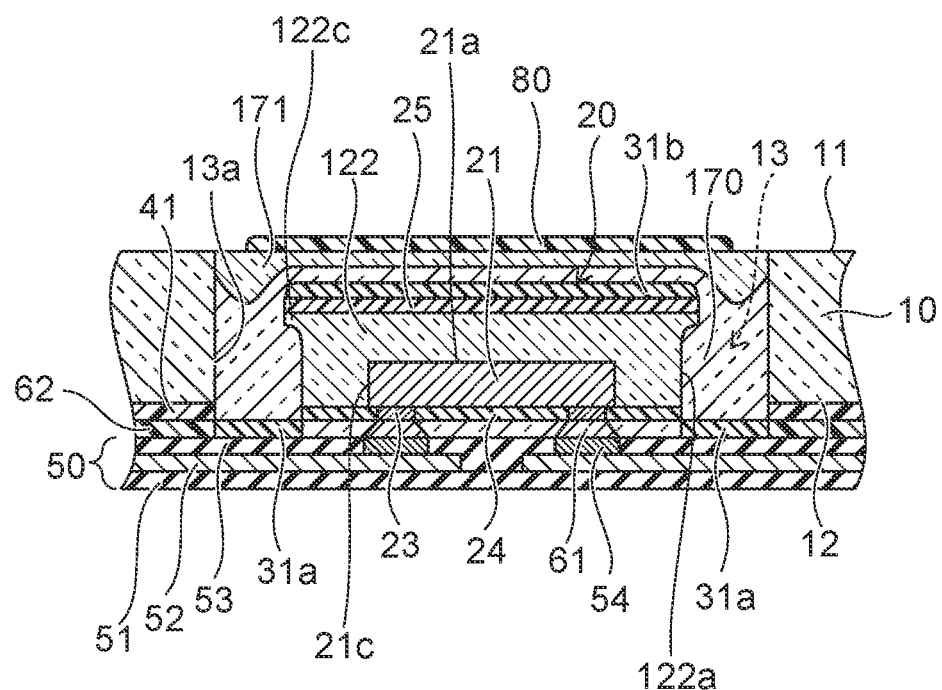
FIG. 17 is a schematic cross-sectional view of a portion of a planar light source of another embodiment of the invention.

FIG. 17 is a schematic cross-sectional view of a portion of a planar light source of another embodiment in which the light source 20 is provided.

The light source 20 includes a first light-transmitting member 122 that covers the element upper surface 21a and the element side surface 21c of the light-emitting element 21. Similarly to the first light-transmitting member 22 described above, the first light-transmitting member 122 also includes a first side surface 122a, and a protrusion 122c that protrudes toward the inner side surface 13a side of the through-hole 13 from the first side surface 122a.

The first light-transmitting member 122 is a light-transmitting resin member that is transmissive to the light emitted by the light-emitting element 21 and substantially does not include (substantially free of) a fluorescent substance. A fluorescent substance is included in a second light-transmitting member 170 that is provided inside the through-hole 13 and covers the light source 20 and the first resin layers 31a and 31b.

The second light-transmitting member 170 includes a light-transmitting resin that is transmissive to the light emitted by the light-emitting element 21, and a fluorescent substance that is dispersed in the light-transmitting resin.

In the example shown in FIG. 17, a third light-transmitting member 171 is provided on the second light-transmitting member 170 inside the through-hole 13. The third light-transmitting member 171 is a light-transmitting resin member that is transmissive to the light emitted by the light-emitting element 21. The second resin layer 80 is provided on the third light-transmitting member 171. The through-hole 13 may be filled with only the second light-transmitting member 170.

The embodiments of the present disclosure have been described with reference to specific examples. However, the present disclosure is not limited to these specific examples.

Based on the above-described embodiments of the present disclosure, all embodiments that can be implemented with appropriately design modification by one skilled in the art are also within the scope of the present disclosure as long as the gist of the present disclosure is included. Besides, within the scope of the spirit of the present disclosure, one skilled in the art can conceive various modifications, and the modifications fall within the scope of the present disclosure.

What is claimed is:

1. A method for manufacturing a planar light source, the method comprising:
    preparing a structure body including
        a wiring substrate,
        a light guide plate arranged over the wiring substrate, the light guide plate including a first major surface, a second major surface facing toward the wiring substrate at a side opposite to the first major surface, and an inner side surface defining a first hole extending from the first major surface to the second major surface with an opening on a first major surface side, and
        a light source arranged on the wiring substrate in the first hole, the light source including
            a light-emitting element including an element upper surface, an element lower surface, and an element side surface between the element upper surface and the element lower surface, and
            a first light-transmitting member covering the element side surface and the element upper surface, the first light transmitting member including a first side surface and a protrusion, the protrusion including a second side surface protruding from the first side surface toward the inner side surface of the light guide plate;
    injecting a first resin material downward through the opening of the first hole of the structure body, the first resin material including a light-diffusing agent; and
    curing the first resin material to form a first resin layer on the wiring substrate between the inner side surface of the light guide plate and the first side surface of the first light-transmitting member.

2. The method according to claim 1, wherein
    the injecting of the first resin material includes injecting the first resin material onto an upper surface of the light source, and
    the curing of the first resin material includes curing the first resin material on the light source.

3. The method according to claim 1, wherein
    the injecting of the first resin material includes injecting the first resin material into the first hole in a state in which the first major surface of the light guide plate is covered with a mask.

4. The method according to claim 1, wherein
    the preparing of the structure body includes preparing the light source, and
    the preparing of the light source includes:
        preparing the first light-transmitting member that is sheet-shaped;
        placing a plurality of light-emitting elements on the first light-transmitting member;
        covering the element side surface and the element upper surface of each of the light-emitting elements with the first light-transmitting member;
        forming a first trench having a first width between the plurality of light-emitting elements by using a first blade having a first blade thickness to remove a portion of the first light-transmitting member; and
        cutting the first light-transmitting member at a bottom surface of the first trench by using a second blade having a second blade thickness to remove a portion of the first light-transmitting member, the second blade thickness being less than the first blade thickness.

5. The method according to claim 1, further comprising forming a second light-transmitting member on the first resin layer.

6. The method according to claim 5, further comprising forming a second resin layer on the second light-transmitting member, the second resin layer including a light-diffusing agent.

7. The method according to claim 1, wherein
    the preparing of the structure body includes preparing structure body including the light guide plate and a light-reflective member arranged on a second major surface side of the light guide plate, with light-reflective member defining a second hole at a same position as the first hole of the light guide plate in a plan view.

8. The method according to claim 7, wherein
    the preparing of the stacked structure body includes:
        preparing a first stacked structure body that does not include a hole; and
        forming a through-hole in the first stacked structure body, the through-hole constituting the first hole and the second hole.

9. The method according to claim 8, wherein
    the preparing of the structure body includes:
        disposing the light source on the wiring substrate; and
        bonding the stacked structure body to the wiring substrate with the light source being positioned in the through-hole.

10. A planar light source comprising:
    a wiring substrate;
    a light guide plate arranged over the wiring substrate, and including a first major surface, a second major surface at a side opposite to the first major surface, the light guide plate defining a first hole extending from the first major surface to the second major surface with an opening on a first major surface side;
    a light-reflective member arranged between the wiring substrate and the second major surface of the light guide plate, the light-reflective member defining a second hole at a position overlapping the first hole of the light guide plate in a plan view;
    a light source placed on the wiring substrate in a through-hole defined by the first hole and the second hole, the light source including
        a light-emitting element including an element upper surface, an element lower surface, and an element side surface between the element upper surface and the element lower surface, and
        a first light-transmitting member covering the element side surface and the element upper surface and including a first side surface and a protrusion, the protrusion including a second side surface protruding from the first side surface toward an inner side surface of the through-hole; and
    a first resin layer arranged on the wiring substrate in the through-hole, the first resin layer being light-reflective.

11. The planar light source according to claim 10, wherein the first resin layer is arranged on the light source.

12. The planar light source according to claim 10, further comprising
    a second light-transmitting member on the first resin layer.

13. The planar light source according to claim 12, further comprising
a second resin layer on the second light-transmitting member, the second resin layer including a light-diffusing agent.

14. A light source comprising:
a light-emitting element including an electrode at a lower surface of the light-emitting element;
a first light-transmitting member covering a side surface and an upper surface of the light-emitting element, the first light-transmitting member including a first side surface and a protrusion, the protrusion including a second side surface protruding outward of the first side surface; and
a light-modulating member covering an upper surface of the first light-transmitting member, the light-modulating member being configured to partially reflect and partially transmit light emitted by the light-emitting element, wherein the protrusion is positioned at an upper end of a side surface of the first light-transmitting member, and
the light-modulating member is disposed on an upper surface of the protrusion.

15. The light source according to claim 14, wherein
the first light-transmitting member includes a fluorescent substance.

16. The light source according to claim 14, further comprising
a cover member that is reflective to light emitted by the light-emitting element,
wherein the first light-transmitting member covers a portion of the side surface of the light-emitting element, and
the cover member covers a portion of the side surface of the light-emitting element below the portion covered by the first light-transmitting member.

* * * * *